United States Patent
Vanfleteren et al.

(10) Patent No.: US 6,555,414 B1
(45) Date of Patent: Apr. 29, 2003

(54) FLIP-CHIP ASSEMBLY OF SEMICONDUCTOR DEVICES USING ADHESIVES

(75) Inventors: Jan Vanfleteren, Gentbrugge (BE); Sergei Stoukach, Heverlee (BE); Bjorn Vandecasteele, Ghent (BE)

(73) Assignee: Interuniversitair Microelektronica Centrum, vzw, Leuven (BE)

( * ) Notice: Subject to any disclaimer, the term of this patent is extended or adjusted under 35 U.S.C. 154(b) by 0 days.

(21) Appl. No.: 09/780,836

(22) Filed: Feb. 9, 2001

Related U.S. Application Data
(60) Provisional application No. 60/181,402, filed on Feb. 9, 2000.

(51) Int. Cl.$^7$ ............................................... H01L 21/44
(52) U.S. Cl. ........................ 438/108; 438/119; 438/127
(58) Field of Search ................................. 438/106, 108, 438/118, 119, 127

(56) References Cited

U.S. PATENT DOCUMENTS

| | | | | |
|---|---|---|---|---|
| 5,817,545 A | * | 10/1998 | Wang et al. ................. | 438/127 |
| 6,071,371 A | * | 6/2000 | Leonard et al. ............. | 156/297 |
| 6,100,597 A | * | 8/2000 | Nakamura ................... | 257/787 |
| 6,214,635 B1 | * | 4/2001 | Akram et al. ................ | 438/51 |
| 6,214,642 B1 | * | 4/2001 | Chen et al. .................. | 438/108 |
| 6,242,513 B1 | * | 6/2001 | Zhou et al. .................. | 523/427 |
| 6,268,739 B1 | * | 7/2001 | Bernier et al. .............. | 324/755 |
| 6,271,058 B1 | * | 8/2001 | Yoshida ....................... | 438/108 |
| 6,306,688 B1 | * | 10/2001 | Lunceford ................... | 438/127 |
| 6,399,178 B1 | * | 6/2002 | Chung ......................... | 428/131 |

OTHER PUBLICATIONS

Wong et al., "High Performance No Flow Underfills for Low–Cost Flip–Chip Applications," 1997 Electronic Components and Technology Conference, IEEE, pp. 850–858.*

Wong et al., "High Performance No Flow Underfills for Low–Cost Flip–Chip Applications," *1997 Electronic Components and Technology Conference, IEEE*, pp. 850–858.

Wong et al., "High Performance No-Flow Underfills for Low–Cost Flip Chip Applications: Material Characterization," *IEEE Transactions on Components, Packaging, and Manufacturing Technology—Part A*, vol.21, No. 3, Sep. 1998, pp. 450–458.

Shi et al., "High Performance Underfills for Low–Cost Flip–Chip Applications," *1997 International Symposium on Advanced Packaging Materials*, pp. 42–45.

* cited by examiner

*Primary Examiner*—Kamand Cuneo
*Assistant Examiner*—Scott B. Geyer
(74) *Attorney, Agent, or Firm*—McDonnell Boehnen Hulbert & Berghoff

(57) ABSTRACT

The present invention is related to a flip-chip-on-board (FCOB) assembly technology applicable for mounting large chips with high I/O count or small pitch, mounted on low-cost or low-grade substrates. The assembly technology uses both an isotropically conductive adhesive (ICA) and a non-conductive material (NCA) in the same assembly cycle. The thermocompression step establishes at the same time the electrical and mechanical interconnections and the curing of the adhesives.

33 Claims, 8 Drawing Sheets

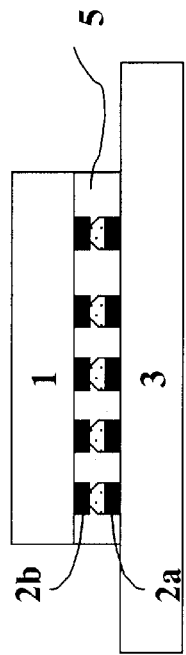
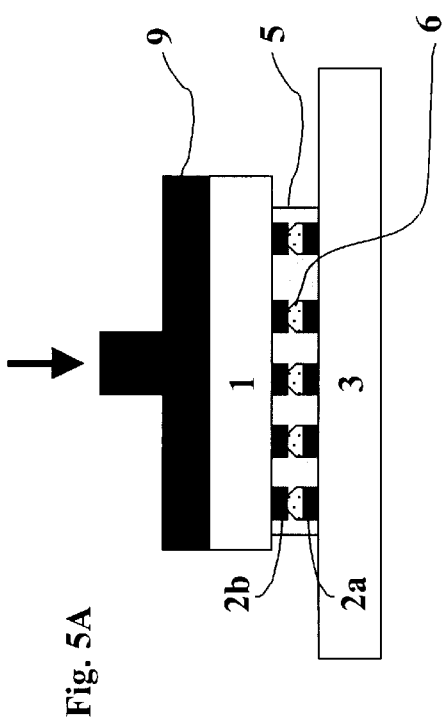
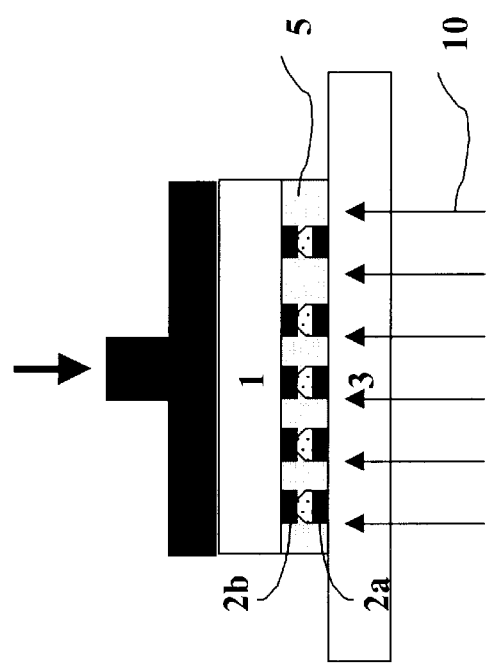

FLIP-CHIP ASSEMBLY OF SEMICONDUCTOR DEVICES USING ADHESIVES

REFERENCE TO RELATED APPLICATIONS

This application claims priority benefits to the United States provisional application Serial No. 60/181,402 filed on Feb. 9, 2000. This application incorporates by reference in its entirety the U.S. provisional application Serial No. 60/181,402 filed on Feb. 9, 2000.

FIELD OF THE INVENTION

The present invention relates to a method for assembling semiconductor devices on a substrate, such as a PCB substrate (printed circuit board), using a flip-chip assembly technique.

BACKGROUND OF THE INVENTION

Printed-circuit-board (PCB) assemblies, such as for telecommunications applications, are designed and produced with a high reliability as an important criterion. Therefore the technologies, applied in these assemblies, are often limited to well established and qualified technologies like reflow and wave soldering of standard SMT (surface-mount-technologies) and through-hole components. However, increasing demands for miniaturization, higher functionality, higher number of pins and higher frequencies put pressure on the telecommunications equipment manufacturers to introduce more advanced packaging technologies such as BGA (ball-grid-array), CSP (chip-size-package) and flip-chip assembly. These assembly techniques must cope with the requirements of, for example, larger chip size, increased number of pins or bonding pads, smaller pitch size, i.e. the distance between adjacent or neighboring pins or bond pads.

Flip chip bonding technologies provide a high package density and electrical performance compared to other LSI (large-scale-integration) packaging technologies. Several flip chip bonding techniques have been developed, mostly based on solder bonding of the chip to the substrate. According to the conventional flip chip assembly processes, the chip is attached to the substrate connecting the bonding pads by reflowed solder bumps. Afterwards the underfill material is dispensed alongside the edges of the bonded chip and allowed to flow in between the bonded chip and the interconnect substrate by means of capillary action. Finally, the underfill material is cured. The underfill material is the material used to fill the fixed stand-off gap between the chip and the substrate and in between the solder bumps connecting both parts.

In "low-cost High throughput Flip Chip Processing" by D. Baldwin et al. in "Advance Packaging Magazine", January 2000, an alternative flip chip solder based bonding technique is proposed. First, a controlled volume of underfill material is stencil printed over the bonding pads. Next, solder paste is printed onto the board or substrate. Then, chips or SMT components are placed onto the substrate, having the chip bumps aligned to the bonding pads, compressing the liquid underfill material until the components make sufficient electrical and mechanical contact with the substrate. Finally the solder bumps are reflowed and the underfill material is cured. Although this alternative partly eliminates the time-consuming step of having the underfill material flow from the edge underneath the bonded chip, the proposed process still uses lead-bearing solder to form an electrical connection between the SMT component and the PCB-substrate.

In modern electronic assemblies, attempts are made to replace Pb/Sn solder with a number of alternative materials. This trend is driven by environmental reasons but also by the need to assemble components having finer or smaller pitch size. Among these alternative materials, leadless solders and adhesives are the most prominent candidates. With respect to the adhesives one distinguishes anisotropic conductive adhesives (ACAs), isotropic conductive adhesives (ICAs) and non-conductive adhesives (NCAs). An ACA consists merely of an electrically isolating NCA, wherein conductive particles, e.g. Ni/Au coated resin spheres, are dispersed. The content of dispersed conductive particles is limited to a few weight percent, and the particles are not linked to form chains. These particles form, after curing, a conductive path in a direction perpendicular to the substrate and the bonded component. An ICA also consists of an NCA but contains a very high content of conductive particles, e.g. silver flakes. After curing of the adhesive, the ICA therefore conducts isotropically.

In "Evaluation of Isotropic Conductive Adhesives (ICA) for Solder Replacement" by R. Pernice et al. in "International Society for Hybrid Microelectronics (ISHM)" Proceedings 1994, pp. 561–565, adhesives are used to bond coarse pitch components such as chip capacitors and resistors on a standard FR4-laminate substrate. Several ICA's were used to create an adhesive junction between the bonding lands on the substrate and the bonding pads of the SMT components under test. The adhesive junction is established by dispensing the adhesive on the bond pad metallizations, mounting the chip onto the bond pads and applying an appropriated heat and/or pressure process. The author reported non-consistent electrical stability or even mechanical failure of the adhesive junctions.

AIMS OF THE INVENTION

An aim of the present invention is to offer, in comparison to the state of the art, a simplified, reliable and cost-effective assembly process.

In particular, the invention aims to present a reliable assembly process, employing adhesives, applicable for all type of substrates, even for cheap, low-temperature substrates.

The invention further aims to offer a reliable assembly process, employing adhesives, applicable for mounting fine pitch components.

Finally, the invention aims to form units where both advanced (i.e. according to the invention) and classical (i.e. solder based) assemblies are present on the same PCB or other substrate. For such "mixed assembly" units, the invention proposes an assembly technique compatible with the classical one. One can hence choose the most appropriate assembly technique for each specific component to be attached on a substrate.

SUMMARY OF THE INVENTION

The present invention relates to a process for manufacturing an apparatus comprising at least one substrate and at least one component. In one aspect of the invention, an underfill material is applied to the substrate prior to the fusing or bonding of the substrate to the component. Thereafter, the substrate is bonded or fused to the at least one component. Through the process of bonding, electrical contact is made between the substrate and the at least one component. In one embodiment, electrical contact is made between bonding pads on the substrate with bonding pads on the component. There are several methods of bonding the substrate to the component including exerting a mechanical pressure so that contacts on the substrate and contacts on the component are bonded using an isotropically conductive adhesive, i.e. ICA. An alternate method is using soldering to bond the substrate with the component. When soldering, mechanical pressure may also be used for bonding.

In another aspect of the invention, a process for manufacturing an apparatus comprising at least one substrate and at least one component is disclosed. The component is attached to and in electrical contact with said substrate, characterized in that said process comprises the following steps:
  providing a substrate, comprising on its surface a plurality of metal areas, called bonding pads or contact pads,
  providing a component, comprising a plurality of metal areas, such as pins or bumps, also called bonding pads or contact pads, said bonding pads on said component corresponding to at least one group of said bonding pads on said substrate,
  dispensing an adhesive onto said bonding pads of said substrate or onto said bonding pads of said component, drying said ICA,
  applying an underfill material in a predefined pattern on an area situated between said bonding pads of said substrate,
  aligning said component so that said bonding pads of said component are directly above one group of bonding pads of said substrate,
  exerting a mechanical pressure on said component, while maintaining said mechanical pressure and said predefined distance, performing a curing step, also called a thermocompression step, to cure said adhesive (e.g., isotropically conductive adhesive) and said underfill material (NCA) thereby creating electrical contacts between said component and said substrate.

According to an embodiment, the adhesive used is an isotropically conductive adhesive, i.e. ICA.

Moreover, according to an embodiment, the step of exerting a mechanical pressure includes exerting a mechanical pressure on said component until a predefined distance is reached between said component and said substrate, whereby corresponding bonding pads (2a, 2b) of said component and said substrate are both in contact with said ICA.

According to an embodiment of the present invention, the material of said substrate is chosen from the group consisting of FR4, FR5, glass-epoxy materials, ceramic materials, polyimide, polyester, alumina based materials and plastic materials.

According to an embodiment of the present invention, said component is chosen from the group consisting of a packaged semiconductor chip, a non-packaged semiconductor chip, a naked semiconductor die and a component made of a non-semiconductor material.

According to an embodiment of the present invention, said ICA is a non-conductive epoxy comprising at least 80 weight percent of silver flakes.

According to an embodiment of the present invention, said underfill material is a non-conducting adhesive (NCA). Said NCA can be a non-conducting epoxy.

According to an embodiment of the present invention, said drying step is performed in an oven at a temperature below the curing temperatures of both the ICA and the underfill material. According to another embodiment, said drying step is performed at a temperature of maximum 110° C.

According to an embodiment of the present invention, said curing step is performed with a curing temperature of maximum 130° C.

According to an embodiment of the present invention, said step of aligning and exerting a mechanical pressure is performed in a first tool, and wherein said step of simultaneous pressing and curing is performed in a second tool, after transporting the assembly formed by said substrate and said component from said first tool to said second tool.

According to an embodiment of the present invention, said thermocompression step is performed using a thermode which has a suitable size and shape to exert a uniform mechanical pressure on said component and which comprises a heat source in order to bring said component and said substrate in contact with said component to the curing temperature.

According to an embodiment of the present invention, said curing step is performed by light radiation, preferably UV radiation. Said radiation can be performed in a separate tool.

According to an embodiment of the present invention, the process further comprises the assembling of components onto said substrate by reflow soldering and/or by wave soldering. According to a preferred embodiment of the invention, said reflow soldering and/or said wave soldering are performed after one or several components have been assembled according the process of the invention.

The present invention is equally related to an apparatus manufactured by the process according to any one of the preceding claims.

BRIEF DESCRIPTION OF THE DRAWINGS

FIGS. 3A and 3b show a schematic top view of a component (1) after mounting on a substrate (3), wherein FIG. 3A shows a small chip, large pitch and bonding pad size and FIG. 3B shows a large chip, small pitch and bonding padsize.

FIGS. 5A–5C illustrates the partial process sequence according to an embodiment of the invention.

DETAILED DESCRIPTION OF PREFERRED EMBODIMENTS OF THE INVENTION

Figure 1A:
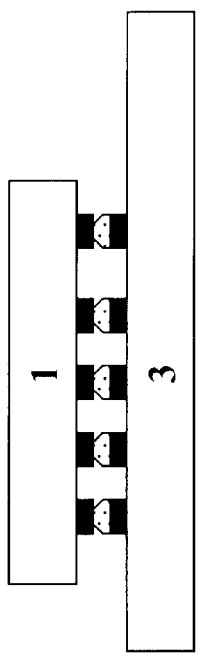
FIGS. 1A–1D illustrates an underfilling process in a solder-based assembly technology according to the prior art.
Figure 1B:
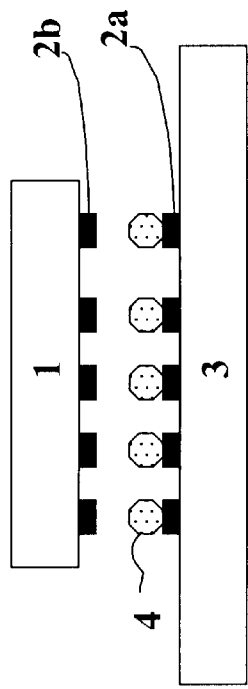
Figure 1C:
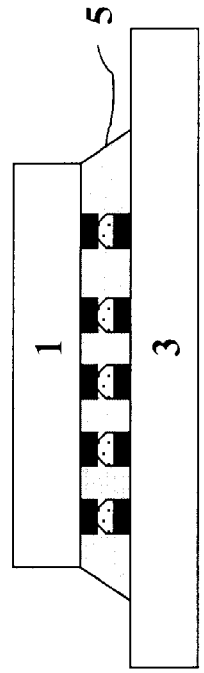
Figure 1D:
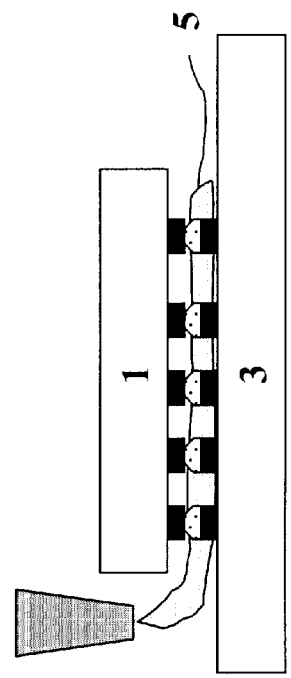
Figure 2A:
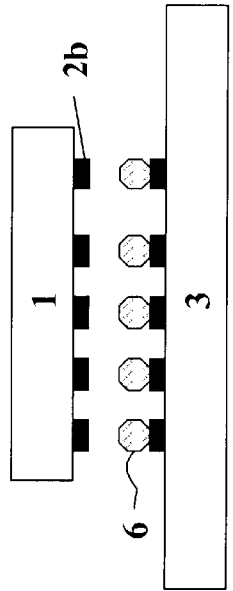
FIGS. 2A–2E illustrates an underfilling process in an adhesive-based assembly technology according to the prior art.
Figure 2B:
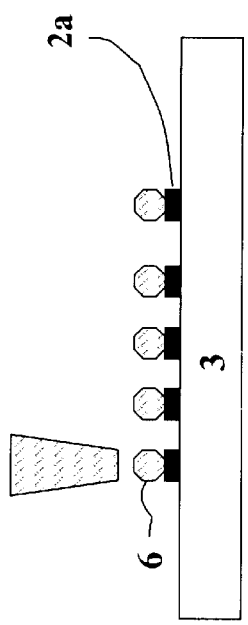
Figure 2C:
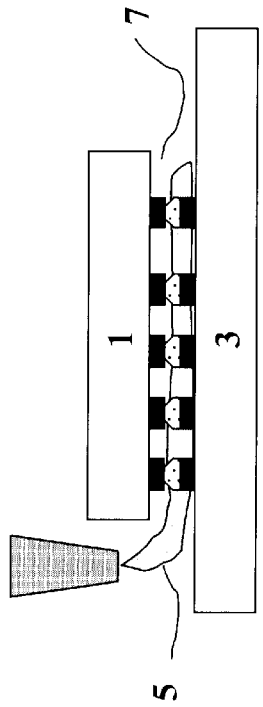
Figure 2D:
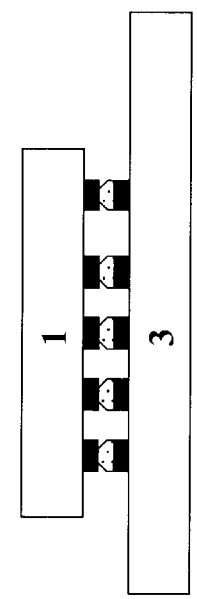
Figure 2E:
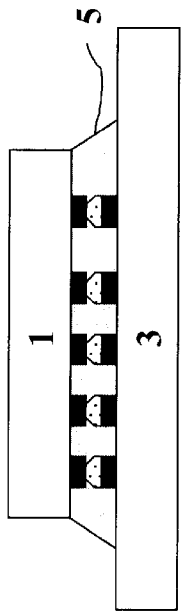

In relation to the appended drawings the present invention is described in detail in the sequel. It is apparent however that a person skilled in the art can imagine several other equivalent embodiments or other ways of executing the present invention, the spirit and scope of the present invention being limited only by the terms of the appended claims.

As a starting point, two prior art processes are illustrated in FIGS. 1 and 2.

FIGS. 1A–1D show the steps of a process, wherein solder bumps are used to form the electrical connection between the component 1, e.g. a semiconductor chip and the substrate 3.

The subsequent steps are:

Step S1 (FIG. 1A): providing a substrate 3 comprising a plurality of metal areas called bonding pads or contact pads 2a and the component 1, equally comprising a plurality of bonding pads (2b), which can be chip bumps or pins, corresponding to said bonding pads (2a) on the substrate;

Step S2 (FIG. 1B): aligning and attaching the component 1 to the substrate 3 by connecting the bonding pads 2a and 2b by reflowed solder bumps 4;

Step S3 (FIG. 1C): dispensing the underfill material 5 along the edges of the bonded component 1;

Step S4 (FIG. 1D): curing the underfill material.

Problems resulting from this first conventional process have been mentioned above.

Moreover, as outlined above, the use of ICA for flip chip bonding in the prior art is limited to small area chips with a limited number of I/O-ports, the I/O pads having rather large dimensions. ICA is used in the prior art to flip chip components on substrates, such as glass, having a low CTE (coefficient of thermal expansion). Examples of such chips are chip capacitors or resistors. The conventional process, known from prior art and used to flip chip such components, limited in size and number of bonding pads, contains the following steps (FIG. 2A–E):

Step P1 (FIG. 2A): Application of the ICA 6 on the substrate bonding pads 2a by screen printing or dispensing of the ICA, or alternatively, application on the chip bumps 2b by stamping the chip into the ICA;

Step P2 (FIG. 2B): Alignment to and placement of the component 1 on the substrate 3;

Step P3 (FIG. 2C): Curing of the ICA to establish the electrical connection between the electrodes 2b and 2a of the component 1 and of the substrate 3 respectively;

Step P4 (FIG. 2D): Application of an underfill material 5, filling the cavity 7 between component 1 and substrate 3;

Step P5 (FIG. 2E): Curing of the underfill material 5.

The difference in CTE between the mounted component 1 and the substrate 3 will create stress in the layers interposed between both parts. The underfill material is used to alleviate the stress, caused by this mismatch in CTE, by distributing this stress all over the chip area.

Figure 3B:
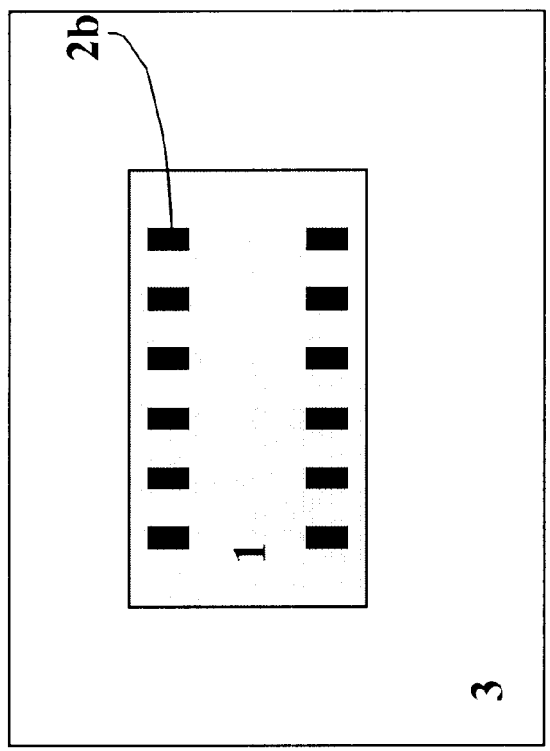
Figure 3A:
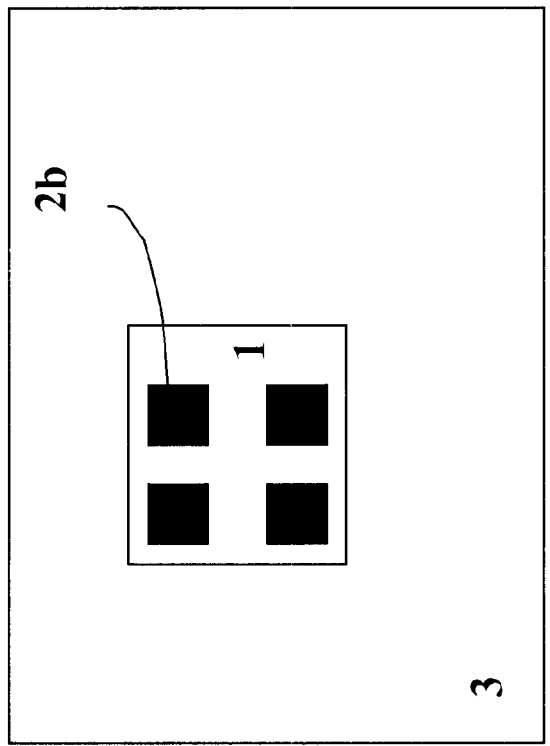

In the absence of underfill material, the ICA that is dispensed on the bonding pads 2a and forms the joining layer between the component 1 and the interconnect substrate 3, must handle this stress by itself. In case of large pitch components, e.g. 350 micrometer or more, with a small number of Input/Output (I/O) ports, a relatively large bond pad area is available to form the electrical contact between the component and the substrate (FIG. 3A). On such large bonding pads a relatively large amount of adhesive can be dispensed for forming the adhesive junction. For such specific applications the voluminous adhesive junction is able to absorb the mechanical stress created by the difference in thermal expansion.

In the conventional process outlined above, there is during the steps P1-P2-P3 no underfill material present. If such process sequence is applied to large chips, chips with a larger number of I/O ports or chips with a small dimension of the bonding pads or contact area between chip bumps and substrate (such as illustrated in FIG. 3B), the adhesive junction can not handle the thermomechanical stress. In particular, the assembly is very prone to fail during the phase P3, after curing of the ICA and before the application of the underfill material. At this stage in the assembly sequence, all mechanical stress, resulting from the CTE mismatch, manipulation of the assembly or from any other origin, must be handled by the cured and consequently rigid ICA making up the relatively small interconnection surfaces. Very often failures have occurred before the underfill material is applied in step P4, resulting in non-yielding electrical contacts. In these conventional assembly methods, the phase in the assembly cycle during which high amounts of stress are exerted mainly on the joining adhesive, causes failures and results in limited reliability of the assembly or contacts. The larger the thermal mismatches between component and substrate, for a given contact area, the more probable the mechanical contact between component and substrate will fail.

One aspect of the present invention comprises technology for connecting chips to a substrate using the flip-chip interconnection technology, applying a combination of an isotropically conducting material and a non-conducting material. Experiments have shown that in this way highly reliable assemblies can be realised, with large chips, e.g. up to 15 mm×15 mm, fine pitch, e.g. down to 125 micrometer, and on low-cost or low grade substrates like FR4 PCB material, which have a lot of warping and a high thermal mismatch with the mounted Si chips.

In a first embodiment of the present invention, illustrated in FIGS. 4A–4F, an assembly process for flip-chip mounting of devices to a substrate is disclosed, comprising the steps of:

Step I1 (FIG. 4A): providing a substrate 3 comprising a plurality of metal areas called bonding or contact pads 2a and the chip 1, equally comprising a plurality of metal areas (2b) corresponding to said bonding pads (2a) on the substrate. The component's bonding pads (2b) can be chip bumps or pins.

Step I2 (FIG. 4B): Application of the ICA 6 on bonding pads 2a present on the substrate 3.

Step I3: Drying of the ICA.

Step I4 (FIG. 4C: cross section, FIG. 4D: top view): Application of NCA underfill material 5 to the substrate 3 in between the bonding pads 2a.

Step I5 (FIG. 4E): Alignment and placement of the component 1.

Step I6 (FIG. 4F): Execution of a thermocompression step to create electrical contacts between the component 1 and the substrate 3.

First the materials used in the above sequence are outlined; thereafter, the alternative process sequences are disclosed.

The substrate 3, provided in step I1, preferably comprises a stack of dielectric layers, which electrically isolate patterns of electrically conducting tracks formed on or in between these layers. These patterns of conducting tracks can be interconnected through holes formed in these dielectric layers. At least on one surface of the substrate at least one pattern of electrical contact pads 2a is formed. Such pattern of electrical contact pads, also called bonding pads or bonding lands, corresponds to the pattern of electrical contact pads present on a surface of a component or chip to be mounted on the substrate. Each electrical contact pad on the substrate can be connected to a conducting track, to form an electrical connection between electrical contact pads, belonging to the same pattern or to different patterns. The substrate can be made of any rigid or flexible material. The substrate can be any of the materials having a CTE, ranging from 2 to 200 ppm/° C. The CTE can be negative. Commonly used substrates are: printed circuit board (PCB) materials, preferably low-cost materials such as e.g. FR4 (CTE: 15 to 22 ppm/° C.) or FR5, glass-epoxy or epoxy (CTE: 1 to 54 ppm/° C.) materials, ceramic materials such as glass, flexible materials such as polyimide or polyester, alumina-based substrates. The substrate can be of a transparent material. The substrate can be a low-temperature substrate, e.g. plastic materials such as PET, PES or alike materials, even with low melting temperatures. The melting temperature of the substrate must be above the curing temperature of the adhesives. For plastics, the CTE can range from 2 to 200 ppm/° C. The CTE can be negative, i.e. the substrate shrinks with increasing temperature as e.g. for PET-based substrates. The CTE can be in the range of 0 to −10 ppm/° C.

The component affixed to the substrate in step I5, will preferably be a packaged semiconductor chip. The component can also be a non-packaged semiconductor chip or naked die. On the outer surface of the package containing the semiconductor chip or a surface of the naked die, contact pads 2b are present. The semiconductor chip comprises electronic circuits or one or more electronic devices. The bulk of the semiconductor chip is usually made of Si, but can also be formed using any semiconductor compound material such as e.g. GaAs. The component can also be based on other materials, like e.g. plastics. The pattern of contact pads on the package or on the naked die corresponds to a pattern of bonding pads on the substrate. These contact pads usually comprise a stack of metal layers, ending in a surface finish, suited for the interconnection technology according to the present invention. The surface finish is made of materials, having a melting temperature above the process temperatures used. The surface finish layer can comprise plated Ni/Au bumps, Ag/Pt, plated Au/Cu or other metals, but not materials having a melting temperature lower then the maximum temperature reached during the thermocompression step (step I6). For example, eutectic Pb/Sn or solder materials having a comparable melting temperature can not be used if the maximum processing temperature is above the 183° C. melting temperature of this Pb/Sn solder material The adhesive, dispensed on the substrate in step I2 and used to establish an electrical connection between the component and the chip, is selected from the group of isotropic conducting materials (ICA). The adhesive electrically connects each of the bonding pads of the chip to the corresponding contact pads of the substrate. This adhesive must be curable, i.e. having the ability to transform from a wet, paste-like state to a polymerised rigid state at elevated temperatures. Any screen printable or otherwise dispensable conductive material can be used, as long as it is curable. For this purpose very often a non-conductive epoxy is used comprising a high amount, e.g. 80 or more weight percent of silver flakes. In the area of isotropic conductive adhesives the preferred systems are the silver files epoxy adhesives. Typical curing times are in the order of 3–10 minutes at 120–150° C. Acrylic and polyamide type adhesives and silicones are also known but have either lower electrical performance or more difficult processing in case of polyamide. New developments in the field of ICA have been reported using thermoplastic materials consisting of high melting plastics (e.g. PES type). Relatively new developments in the field also are Ag-filled UV-acrylate and UV-initiated epoxy systems making very fast curing at relatively low temperature possible.

The underfill material is a non-conductive material, which can be dispensed or screen-printed, and which can be cured by heating. Non-conductive epoxy adhesives or other underfill materials are suitable. Non-conductive adhesives (either UV-curing or thermally curing systems) also have been successfully used as underfill material.

The step I2 (FIG. 4B) of applying the ICA to the substrate can further comprise the step of dispensing the adhesive on the contact pads 2a of the substrate 3. In one embodiment, dots or bumps of adhesive material are placed on these contact pads. In an alternate embodiment, the step of applying the ICA to the substrate can also further comprise the step of screen or stencil printing the adhesive in case of fine pitch assemblies. The pitch between the contact pads (2a) can be 350 micrometer or less. Preferably, the pitch between the contact pads is less than 200 micrometer. A precise alignment of the printed or dispensed ICA dots to the contact pads on the substrate is advised, certainly if components with small pitch size or small area contact pads are to be mounted to the substrate.

The step I3 of drying of the ICA is done at low temperatures, preferably about 100° C. or less. The drying of the ICA should be done substantially below the glass temperature of the adhesive to prevent polymerisation of the ICA. The drying of the ICA glue can be done at 110° C. in a convection-type oven. At this stage in the process sequence the ICA is not cured or polymerised. The purpose of this drying step is to evacuate the solvents out of the ICA-material and to establish a minimal adherence between the ICA and the bonding land as the glue has more cohesive force. The dried ICA-dot will be kept in place during subsequent process steps. For example the dried ICA-dot may not be swept away from its position due to the NCA flow during the thermocompression step (step I6). By postponing the curing of the ICA until the thermocompression cycle executed in step I6, the component will be removably fixed to the ICA. The component can be removed from the substrate, until the final curing temperature of the ICA is reached. This removable joint offers the opportunity of repairing the joint, of adjusting the alignment of the component etc., even in the last stage of the process sequence.

Figure 4A:
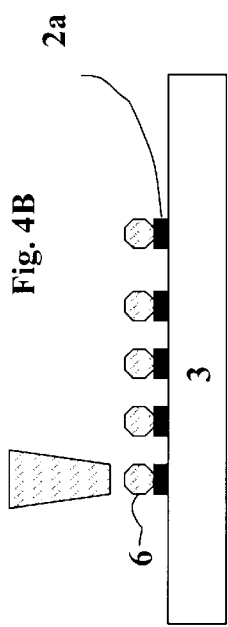
FIGS. 4A–4F illustrates the process sequence according to an embodiment of the invention.
Figure 4B:
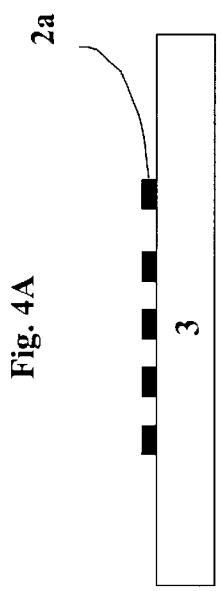
Figure 4C:
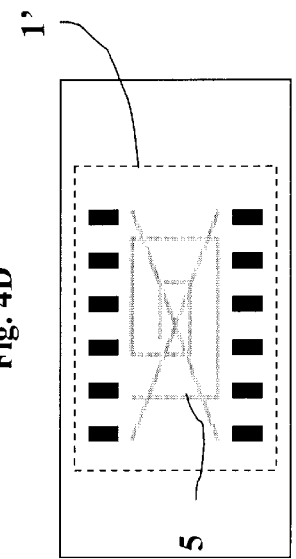

In step I4 (FIG. 4C), the underfill material 5 is applied to the substrate 3. One aspect of the invention is the timing of the application of the underfill material 5. The underfill material 5 is applied prior to the joining of the component with the substrate 3. Moreover, the application of the underfill material 5 may be performed prior to or after the application of the isotropic conducting material(s) 6. Therefore, the application of underfill material 5 (as shown in FIG. 4C) may be performed prior to the step of application of the adhesive material 6 (as shown in FIG. 1). The underfill material is preferably a NCA. The NCA is normally applied in the middle of the chip area (see FIG. 4D: 1'), using dispensing techniques (see FIG. 4D). The NCA can be coated and patterned on the substrate by screen or stencil printing. Very often NCA 5 is distributed along the perimeter and the diagonals of a rectangle or square in the middle of the chip area or as a spiral (see FIG. 4D). With chip area (FIG. 4D: 1') is meant the part of the substrate that is covered by the chip after placement. The chip area is normally outlined by the pattern of bonding pads on the substrate. The amount of NCA and the pattern in which the NCA is distributed on the substrate is such that after placement of the chip to the substrate in step I5, the NCA front reaches the edges of the chip. If the amount and the pattern of the underfill material is optimised, only a minor amount of much NCA might be pressed out of the cavity between chip and substrate. If too much NCA is dispensed, the excess NCA will be squeezed out of the cavity and might dirty the thermode used in subsequent steps.

Figure 4D:
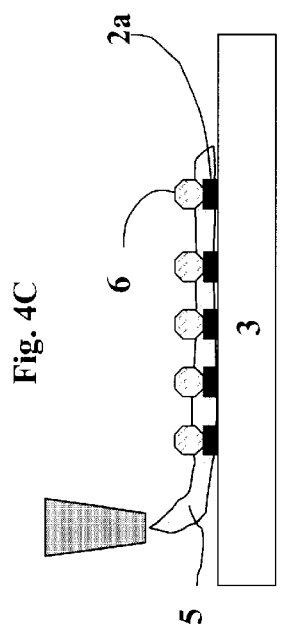
Figure 4E:
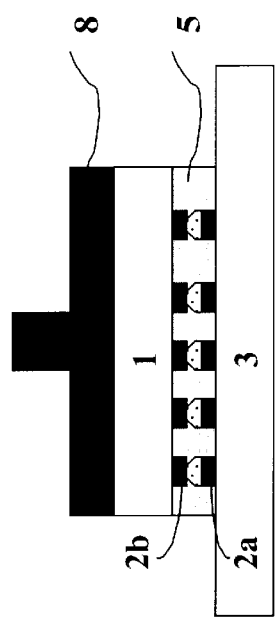
Figure 4F:
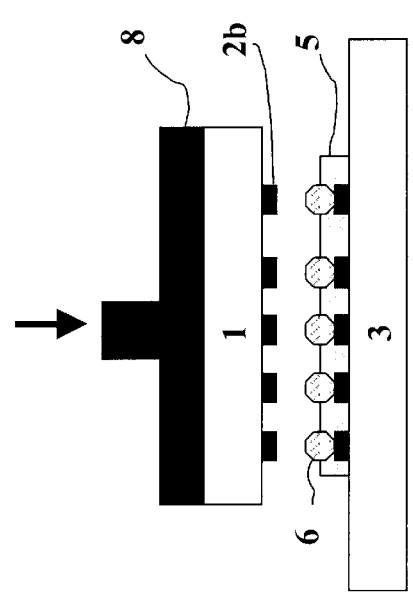

After forming the ICA dots on the bonding lands of the substrate and distributing the NCA in between these ICA dots, the component will be placed on the ICA dots (step I5, FIG. 4E). The component will be accurately aligned to the substrate being partially covered by the dried ICA dots and the wet NCA-paste. The alignment of the chip means that the bonding pads of the component are aligned to the bonding pads of the substrate. After alignment, the component is moved towards the substrate, while executing a certain pressure on the chip. This pressure is preferably distributed uniformly over the area of the component. During the movement of the component, NCA starts to flow towards the edges of the component. The dried ICA-dots are not swept away during this step and remain in substantially the same position. Applying pressure to the component causes the dried ICA to deform and to accommodate with the shapes of the metal bumps of the component and substrate bonding pads. The component will be moved until a given distance between the surface of the component opposite the substrate and the substrate is obtained. The gap between the opposite surface of the component and the substrate is filled with the ICA dots and with the NCA being redistributed. Up to now the component and the non-cured adhesives can be easily removed if needed to correct e.g. an alignment error or improper contact and the assembly cycle can be restarted from the first step.

Finally in step I6 (FIG. 4F), the electrical contacts between the component or chip 1 and substrate 3 contact pads 2 are realised. The position obtained at the end of the previous step is frozen. While maintaining the pressure from the previous step, the adhesives will be heated to a temperature above the curing of the ICA and of the NCA. The heating can be done by the thermode 8, i.e. a tool that executes the pressure on the component and that can provide heat to the component. Due to this heating, the ICA and NCA polymerise and will become solid. Simultaneously the electrical connection between the component and the substrate is formed. A fixed electrical and mechanical connection between the component and the substrate is established. The temperature needed for this polymerisation, depends on the adhesive materials used. The curing temperature is typically 140–150° C. or less. After curing the adhesives, the assembly is cooled down while maintaining the pressure on the component until a certain "tool-up" temperature is reached. At this "tool-up" temperature, the pressure on the chip is released and the thermode 8 will be removed. During the temperature processing, e.g. heating or cooling down, and during the use of the assembled unit, the stress in the assembly, caused by the mismatch of CTE is distributed over substantially the entire surface of the component. The gap between the component and the substrate is filled by both the NCA and ICA, leading to an interconnection interface substantially coinciding with the surface of the component in contact with the substrate.

The proposed assembly sequence eliminates the occurrence of high stress on the small contact areas alone by providing a substrate substantially covered with connecting and underfill material to the component. The coverage will be 80% or more, preferably 90% or more. Contrary to the prior art, the underfill material is dispensed prior to the placement of the chip thereby avoiding that the time-consuming and failure-prone capillary underfill procedure.

In a second embodiment of the present invention, step I5, in which the component is positioned with respect to the substrate and placed on top of the adhesives, is done on a first tool. Again the component will be pushed to the adhesives present on the substrate, until the underfill material substantially fills in a uniform way the gap between both parts, not filled by the ICA bumps. The adherence of the component to the adhesives is such that the assembly can be transported to a second tool while maintaining the position of the component with respect to the substrate. Thanks to the presence of both the NCA and ICA adhesives, possible mechanical stress will be absorbed by both adhesives. The last step, step I6, in which the final electrical and mechanical connections are established is executed on a second tool according to the previous embodiment of the invention. By allowing the placement of the chip and the thermocompression cycle to be executed on two different machines, the throughput of an assembly production line can be increased.

In a third embodiment of the present invention, the curing of the adhesives, thereby establishing an electrical and mechanical connection, is done by ultraviolet (UV) light. This is illustrated in FIGS. 5A–5C. Instead of providing the energy necessary to form the cross links during the polymerisation of the adhesives by the thermode in contact with the component or to the substrate in contact with the supporting table, this energy can be provided for by light, preferably UV-light 10. If a transparent substrate 3, such as e.g. glass or plastic is used, which allows the passage of, e.g. UV radiation without absorbing the light, light curing can be used instead of thermal curing. A first requirement is that the adhesives must be UV curable. If the component is not transparent to the UV radiation, the curing can be executed from the backside of the assembly, i.e. the surface of the substrate opposite the surface connected to the component by applying heat to this surface. For example the table on which the substrate is placed upon can be heated. The adhesives will be illuminated through the transparent substrate. First, the component 1 is placed on the ICA dots 6 and the NCA pattern 5 (FIG. 5A) by a first tool 9, which is similar to the tool 8 used in previous embodiments, but without the heating capacity. Then the assembly of the component removably attached to the substrate is transported to a second tool (FIG. 5B). In this tool, the assembly is exposed to radiation 10 (FIG. 5C) in case a transparent substrate is used. During the curing of the adhesives by heat, UV radiation or a combination thereof, pressure is applied on the assembly. As shown in FIG. 5c, pressure is applied to the component. This pressure will be released after the curing of the adhesives.

In a fourth embodiment of the present invention, a mixed assembly sequence of both adhesive and solder bonding techniques is presented. The combination of embodiments of the present invention with the prior art soldering assembly techniques results in units where both advanced and classical assemblies are present on the same substrate, e.g. a PCB. The present invention can therefore be referred as flip-chip-on-board (FCOB) assembly technology. In such "mixed assembly" units, the present invention proves to be compatible with the classical bonding approaches, e.g. reflow and wave solder assembly, thanks to its robustness. Besides the flip-chip on board (FCOB), other surface mount components can be assembled using the conventional soldering processes without degrading the adhesive flip-chip interconnections.

In such mixed assembly sequence first the adhesive joints are established according to one of the embodiments of the invention. The board with the FCOB can then be treated as a naked or original PCB allowing wave soldering on the flip-chip side of the PCB substrate, i.e. the surface comprising the adhesive connection, and reflow soldering on the opposite side. The flip-chip process becomes transparent to the final surface mounted devices (SMD) and through-hole component assembly. A limitation might be that no reflow soldering can be performed on the flip-chip side using the standard stencil printing method, as the FCOB components create irregularities on the substrate. Standard stencil or screen printing is only feasible on flat substrates. Dispensing techniques or adapted screen printing techniques can overcome this problem and allow reflow soldering at the flip-chip side.

In a previous embodiment of the invention, a mixed assembly is presented, combining assembly technologies on the same PCB substrate. The surface of the substrate on which components are mounted using adhesive flip chip according to the present invention or wave solder according to prior art techniques will be referred to as the top side of the substrate. The opposite surface on which components, i.e. SMD, are mounted using reflow solder, will be referred to as the bottom side of the substrate. The substrate in this example is a PCB substrate.

The first step in the assembly is the realization of the high density interconnect substrate followed by the flip-chip assembly. The second step involves the reflow soldering and wave soldering or ICA-only assembly of a wide range of SMD components on both sides of the board. The following assembly sequence is illustrated:

- Fabrication of high-density interconnection substrate using sequential build-up technology and Ni/Au finish. The size of the PCB was 100×110 mm$^2$.
- Flip-chip assembly according to an embodiment of the invention. FCOB with ICA/NCA of test chips B6, B7 and C4, according to an embodiment of the invention. The characteristics of these chips are given in Table 1.
- Stencil printing of solder paste on the bond lands at the bottom surface of the substrate, followed by the placement of SMD components PBGA256/1.27 mm, PBGA320/1 mm, $\mu$BGA46/0.75 mm, $\mu$BGA188/0.5 mm, TSOP32/0.5 mm, LQFP216/0.4 mm, SOL16/1.27 mm and reflow soldering of these area array and fine-pitch components.
- Glue (NCA) dispensing, component placement (LQFP216/0.4 mm, SOL16/1.27 mm, 0603 and SOT323 components) and curing on flip chip side or top side of the substrate, followed by wave soldering of these components.
- Manual touch-up of fine-pitch (0.4 mm) SMD (LQFP216/ 0.4 mm) component on wave solder side.

Alternatively, the above wave solder step is replaced by ICA dispensing, component placement and ICA curing. LQFP216 pitch may be too small to assemble it with this method. This alternative is referred to as the ICA-only assembly, while the sequence comprising the wave solder bonding is referred to as the wave-solder assembly.

Flip-chip on Board

The first step after the production of the fine-line PCB is mounting the flip-chip components. The developed technology combining the use of ICA and NCA, was applied. The ICA and NCA adhesives used are experimental products from Heraeus. Using these Heraeus adhesives, the maximum temperature during assembly is 130° C. This is the temperature of the thermode during the thermocompression cycle.

The pressure, at which the screen printing of the ICA glue is done, is inversely proportional to the dimension of the pitch. For B-type chips with a pitch ranging from 125 to 150 $\mu$m a pressure of 2.5 bar was used, while for the C-type chips with a larger pitch of 200 $\mu$m a pressure of 0.8 bar was applied. The snap-off was kept at 0.7 mm. The forward speed of the moving parts, e.g. squeegee, was set to 15 mm/s and about 30 mm/s for the returning step. The chips were placed with an accuracy of 5 $\mu$m, using a Karl Süss flip chip bonder.

The non-conductive adhesive used as underfill material was applied by a Asymtek Millenium Dispenser, resulting in the pattern shown in FIG. 4D: first a spiral in the middle of the chip area and the two lines from opposite corners. As shown in FIG. 4D, the dispensed pattern is somewhat offset from the perimeter of the die. During the thermocompression cycle the NCA glue starts to flow and fills the cavity between the die or chip and the board. This step is also called the sealing of the die. If the amount of NCA is not sufficient to seal the die, an additional sealing step might be applied prior to or after the thermocompression step. A line of NCA is dispensed as close as possible to the border of the die and afterwards cured.

A Farco F120 Bonder is used. For the B-type chips a 15×7 mm$^2$ thermode is used, keeping the table at room temperature. The pressure is 1.66 bar. For the larger C-type chips a thermode of the same size was used, but with an opening in the middle. Because of this opening the glue underneath this opening cannot be cured and the table is set to a temperature of 100° C. The pressure applied is 3 bar. The back pressure is 0.8 bar while the main pressure is 4.8 bar. The thermocompression cycle comprises two steps. First a so-called pre-thermocompression cycle of 30 seconds at 30° C. at full pressure, followed by the effective thermocompression cycle of 3 minutes at 130° C. at full pressure. The first step improves the reliability of the assembly. When e.g. an alignment is not sufficient, there will be no good contacts after the first step. In this case the die can still be removed from the substrate, cleaned and reused.

Reflow Soldering

Figure 6:
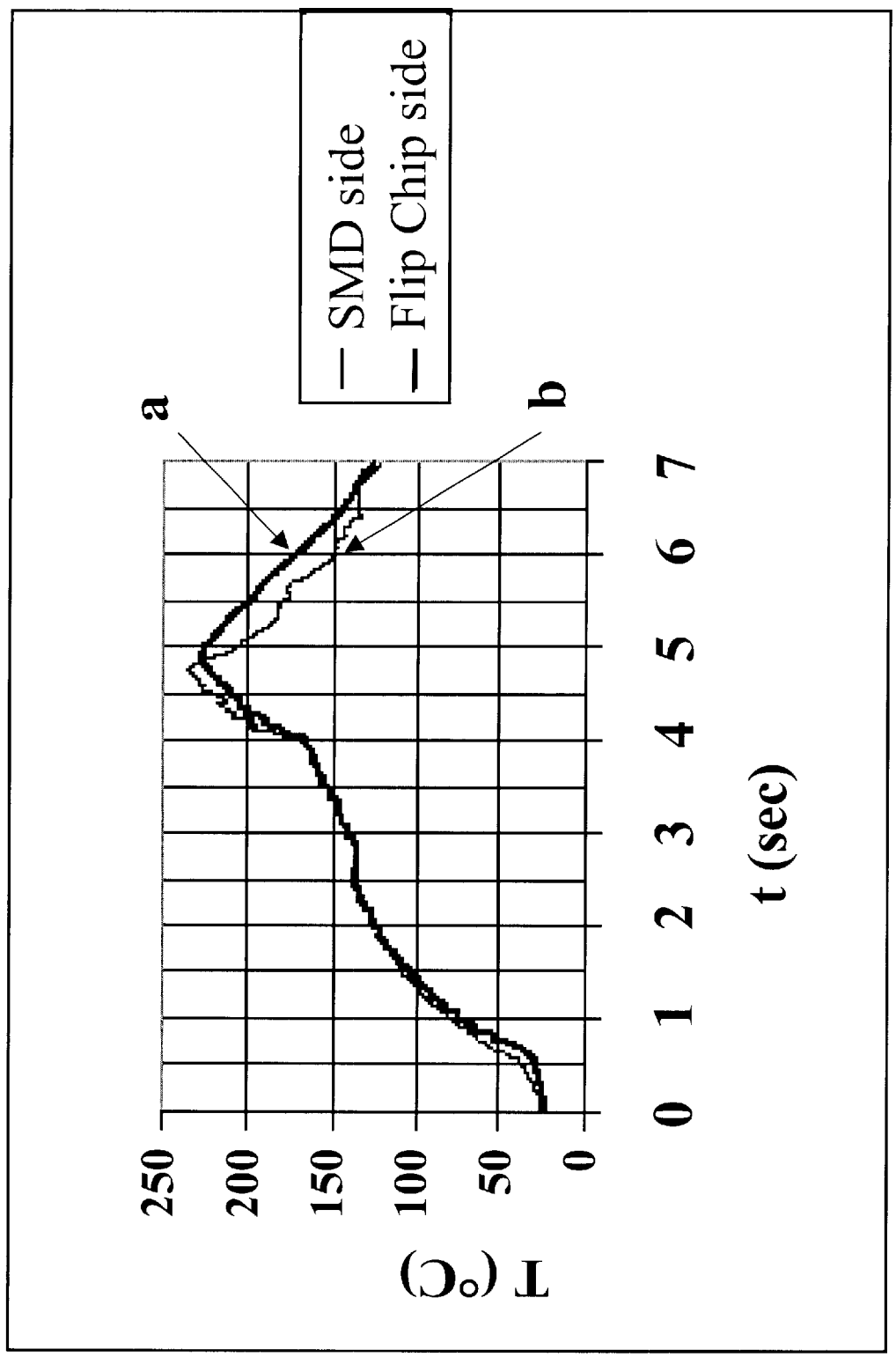
FIG. 6 illustrates the temperature profile during reflow solder sequence as seen by the demonstrator assembly according to a preferred embodiment of the invention with the line designated as "a" being at top or flip-chip side (thick line) and with the line designated as "b) being at bottom or SMD side (thin line).

Following the flip-chip adhesive assembly, reflow solder components are mounted. After stencil printing of the solder paste and component placement, the assembly is subjected to a reflow temperature profile. This temperature profile can be divided into different regions. A first region consists typically of a temperature ramp up with a maximum of 2° C./s up to about 150° C. In this region the solvents in the solder paste are being evaporated. Then the board is further slowly heated towards the melt temperature of eutectic SnPb solder (183° C.) over a time period of 1 to 2 minutes. After the preheating period, the board is quickly heated to typically 235° C. and quickly cooled down again. In this region the actual soldering takes place. To avoid extensive growth of brittle intermetallics in the solder joint, the time above solder melting temperature must be short, typically 1 min. FIG. 6 shows the temperature on both sides: the SMD side (designated as "b") and the flip-chip side (designated as "a"). During this reflow temperature step the flip-chip components can withstand the thermomechanical stress due to the mismatch between substrate and component.

Wave Soldering

Figure 7:
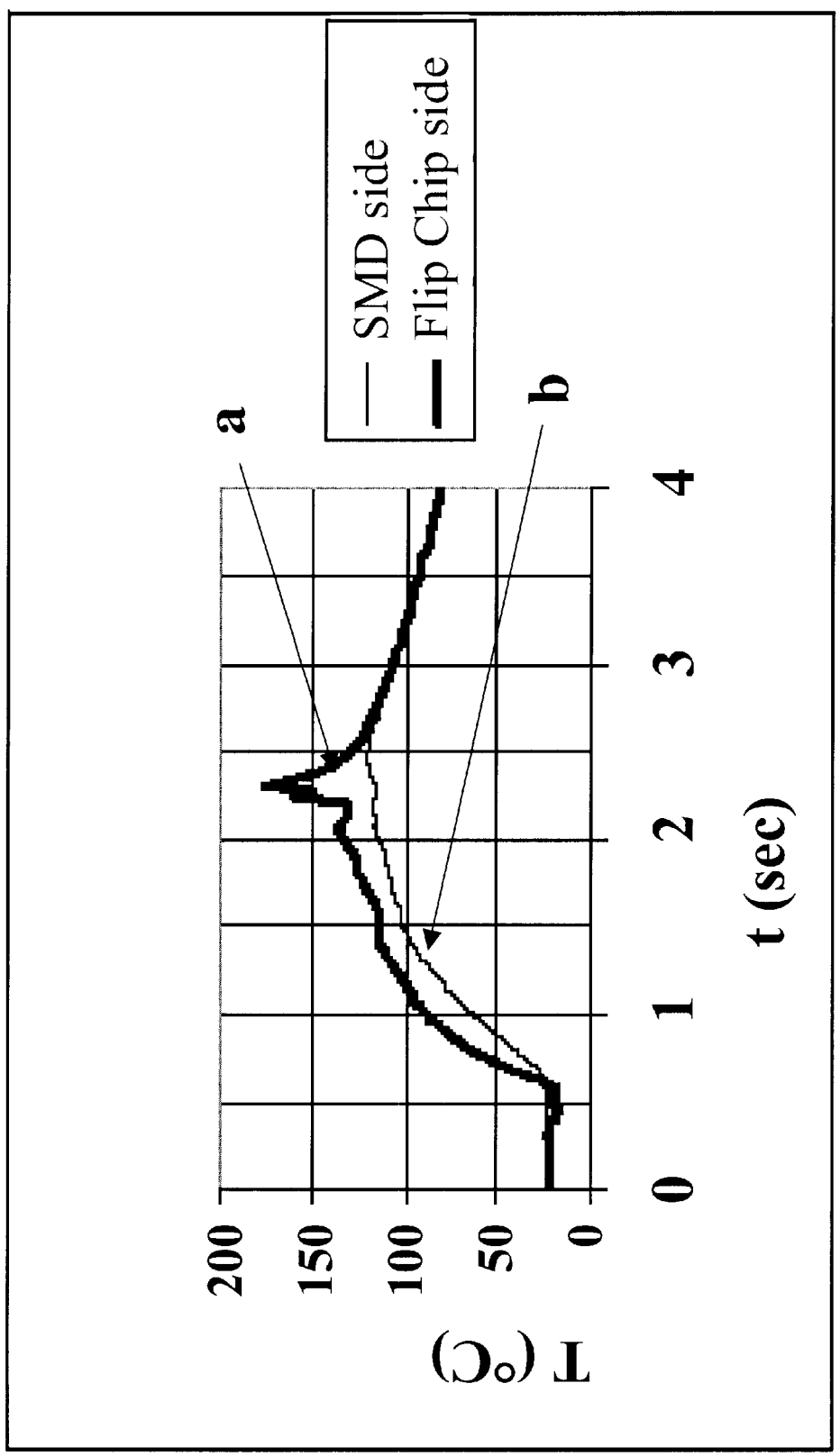
FIG. 7 illustrates the temperature profile during the wave solder sequence as seen by the demonstrator assembly according to a preferred embodiment of the invention with the line designated as "a" being at top or flip-chip side (thick line) and with the line designated as "b) being at bottom or SMD side (thin line).
Figure 8A:
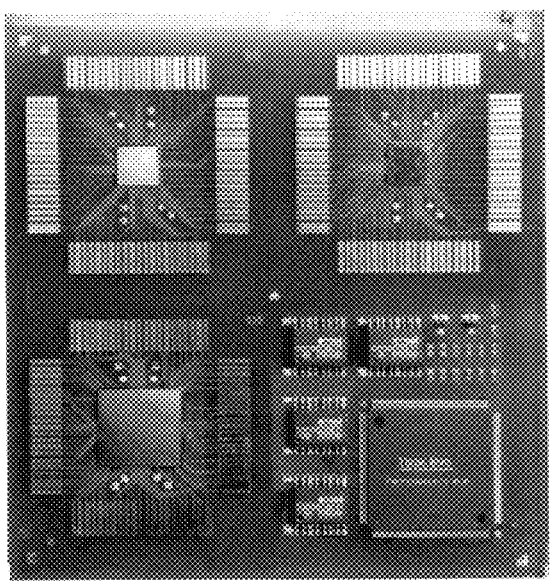
FIGS. 8A and 8B illustrate the finished demonstrator assembly according to a preferred embodiment of the invention with FIG. 8A being the flip-chip and wave solder assembly and FIG. 8B being the flip-chip and reflow solder assembly.
Figure 8B:
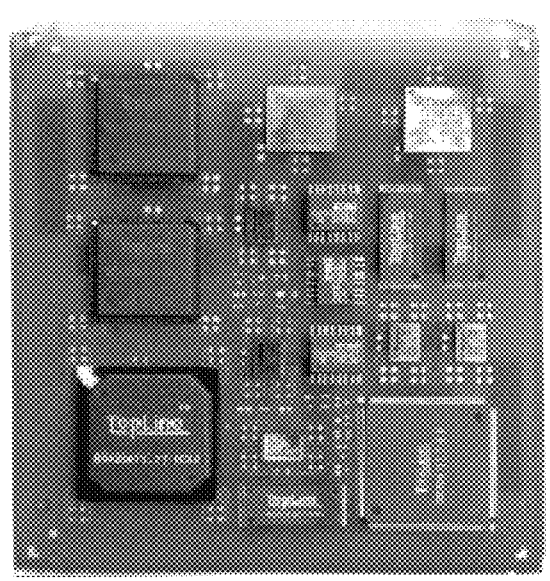

The next assembly phase is the wave soldering. The wave soldering process consists of different steps. In the wave soldering machine, the board first passes across a fluxer which deposits soldering flux onto the board. After fluxing, the board passes through a preheating zone in which the board is heated to a temperature between 100 and 150° C. In this zone, flux solvents are being evaporated and the flux is being activated. An additional function of the preheating stage is to reduce the thermal shock the board experiences when entering the solder wave. After the preheating stage, the components are actually soldered by passing the board over the solder wave. When SMD components are present, a double wave soldering machine is used. Solder wave temperatures are typically 235–255° C. SMD components and thus also the flip-chips are completely immersed in liquid solder for a few seconds (2–4 sec). FIG. 7 shows the temperature at the flip-chip side (designated as "a") (entering the solder wave) and at the SMD side (designated as "b") when passing through the wave soldering equipment. FIGS. 8A and 8B show photographs of a finished demonstrator board (wave solder version). The temperature measured on the board is considerably lower than the actual solder temperature experienced by the solder joints due to the short heating times. This is indicative for the relatively large temperature differences and thus large thermal stresses an assembly may experience during wave soldering.

Testing

In order to monitor the evolution of the quality of the flip-chip assembly during the total assembly process, contact resistance of the flip-chip joints was measured. On 4 demonstrators, the eight four point contact resistance measurement structures on each of the 3 chips B6, B7 and C4 were measured at different significant moments of the total assembly cycle. Table 2 shows the measurement results on demonstrators #3 (ICA-only assembly) and #2 (wave solder assembly). From these measurements following conclusions were made:

- On this set of test samples we observed a 100% contact yield (4 assemblies×3 chips per assembly×8 test structures per chip×4 contacts per structure)
- The flip-chip assemblies withstand reflow soldering, ICA curing step, and even wave soldering. The 7×7 mm² chips show no increase in contact resistance after reflow and ICA curing, and a 50% increase after reflow and wave soldering. In any case, the contact resistance remains low (<25 milli-ohm) with small standard deviation.
- The large C4 chips (15×15 mm ) show a larger average contact resistance and a larger standard deviation, due to the fact that a few values were larger than the normal value of <20 milli-ohm. Indeed the stress under such a large chip is larger. Also the dispensing of the appropriate amount of NCA is more difficult and was not optimal in this example as corners of the chip were not yet fully underfilled.

TABLE 1

Characteristics of dice used for flip-chip assembly.

| Chip ID | B6 | B7 | C4 |
| --- | --- | --- | --- |
| Chip-size (mm²) | 7 × 7 | 7 × 7 | 15 × 15 |
| Total # bond pads | 228 | 184 | 288 |
| I/O pitch (µm) | 125 | 150 | 200 |
| Pad distribution | peripheral | peripheral | peripheral |
| Pad size (µm × µm) | 75 × 75 | 75 × 75 | 100 × 100 |
| Pad spacing (µm) | 50 | 75 | 100 |
| Ni/Au bump height (µm) | 20 | 20 | 20 |

TABLE 2

Contact resistance measurements on mixed assembly demonstrators.

| Demonstrator # | Chip type | Contact resistance ± standard deviation (mΩ) | | | |
| --- | --- | --- | --- | --- | --- |
| | | After flip chip | After reflow | After ICA assembly | After waver sol-der |
| 3 (ICA assembly) | B6 | 15 ± 2 | 17 ± 2 | 16 ± 2 | |
| | B7 | 14 ± 2 | 15 ± 2 | 14 ± 2 | |
| | C4 | 60 ± 156 | 207 ± 351 | 147 ± 200 | |
| 2 (wave solder assembly) | B6 | 16 ± 6 | Not measured | | 23 ± 11 |
| | B7 | 15 ± 4 | Not measured | | 22 ± 8 |
| | C4 | 50 ± 48 | Not measured | | 365 ± 577 |

What is claimed is:

1. Process for manufacturing an apparatus comprising at least one substrate and at least one component, said substrate having a surface with a plurality of bonding pads which are metal, said component having a plurality of bonding pads, the bonding pads on the substrate corresponding to the bonding pads on the component, said component being attached to and in electrical contact with said substrate, characterized in that said process comprises the following steps:

dispensing an adhesive onto said bonding pads of said substrate or onto said bonding pads of said component;

drying said adhesive;

applying an underfill material on an area situated between said bonding pads of said substrate;

aligning the bonding pads of said component with at least some of the bonding pads of the substrate;

exerting a mechanical pressure on said component; and curing said adhesive and said underfill material, said step of curing being performed while maintaining said mechanical pressure, thereby creating electrical contacts between said component and said substrate, wherein during the step of exerting a mechanical pressure on said component, said underfill material substantially fills the non-bonding area of the substrate.

2. Process according to claim 1, wherein the step of exerting a mechanical pressure on said component includes exerting a mechanical pressure until a predefined distance is reached between said component and said substrate, whereby corresponding bonding pads of said component and said substrate are both in contact with said adhesive.

3. Process according to claim 1, wherein said adhesive is an isotropically conductive adhesive.

4. Process according to claim 1, wherein the material of said substrate is selected from the group consisting of FR4, FR5, glass-epoxy materials, ceramic materials, polyimide, polyester, alumina based materials and plastic materials.

5. Process according to claim 4, wherein said component is chosen from the group consisting of a packaged semiconductor chip, a non-packaged semiconductor chip, a naked semiconductor die and a component made of a non-semiconductor material.

6. Process according to claim 5, wherein said adhesive comprises a non-conductive epoxy and at least 80 weight percent of silver flakes.

7. Process according to claim 6, wherein said underfill material is a non-conducting adhesive (NCA).

8. Process according to claim 7, wherein said NCA is a non-conducting epoxy.

9. Apparatus manufactured by the process according to claim 1.

10. Process according to claim 1, wherein the substrate surface has a bonding area containing the bonding pads and a non-bonding area not containing the bonding pads, and wherein the step of applying an underfill material comprises applying an underfill material only to the non-bonding area of the substrate and not to the bonding area of the substrate.

11. Process according to claim 1, wherein the step of drying the adhesive is performed prior to the step of applying an underfill material.

12. Process for manufacturing an apparatus comprising at least one substrate and at least one component, said substrate having a surface with a plurality of bonding pads which are metal, said component having a plurality of bonding pads, the bonding pads on the substrate corresponding to the bonding pads on the component, said component being attached to and in electrical contact with said substrate, characterized in that said process comprises the following steps:

dispensing an adhesive onto said bonding pads of said substrate or onto said bonding pads of said component;

drying said adhesives;

applying an underfill material on an area situated between said bonding pads of said substrate;

aligning the bonding pads of said component with at least some of the bonding pads of the substrate;

exerting a mechanical pressure on said component; and curing said adhesive and said underfill material, said step of curing being performed while maintaining said mechanical pressure, thereby creating electrical contacts between said component and said substrate, wherein the material of said substrate is selected from the group consisting of FR4, FR5, glass-epoxy materials, ceramic materials, polyimide, polyester, alumina based materials and plastic materials, wherein said component is chosen from the group consisting of a packaged semiconductor chip, and non-packaged semiconductor chip, a naked semiconductor die and a component made of a non-semiconductor material, wherein said adhesive comprises a non-conductive epoxy and at least 80 weight percent of silver flakes, wherein said underfill material is a non-conducting adhesive (NCA), wherein said NCA is a non-conducting epoxy, wherein said drying step is performed in an oven at a temperature below the curing temperatures of both the adhesive and the underfill material.

13. Process according to claim 12, wherein said drying step is performed at a temperature of maximum 110° C.

14. Process according to claim 13, wherein said curing step is performed with a curing temperature of maximum 130° C.

15. Process according to claim 14, wherein said step of aligning and at least part of said step of exerting a mechanical pressure is performed in a first tool, and wherein said step of curing and at least part of said step of exerting a mechanical pressure is performed in a second tool, after transporting the assembly formed by said substrate and said component from said first tool to said second tool.

16. Process according to claim 15, wherein said step of curing and at least part of said step of exerting a mechanical pressure is performed using a thermode which has a suitable size and shape to exert a uniform mechanical pressure on said component and which comprises a heat source in order to bring said component and said substrate in contact with said component to the curing temperature.

17. Process according to claim 16, further comprising the assembling of components onto substrate by reflow soldering or by wave soldering.

18. Process according to claim 17, wherein said reflow soldering or said wave soldering are performed after at least one of the components have been assembled.

19. Process according to claim 15, wherein said curing step is performed by light radiation.

20. Process according to claim 19, wherein said curing step is performed by UV light radiation.

21. Process according to claim 19, wherein said radiation is performed in a separate tool.

22. Process according to claim 19, further comprising the assembling of components onto said substrate by reflow soldering or by wave soldering.

23. Process according to claim 14, wherein said steps of aligning, exerting a mechanical pressure and curing are performed in a single tool.

24. Process according to claim 23, wherein said step of curing and at least part of said step of exerting a mechanical pressure is performed using a thermode which has a suitable size and shape to exert a uniform mechanical pressure on said component and which comprises a heat source in order to bring said component and said substrate in contact with said component to the curing temperature.

25. Process according to claim 24, further comprising the assembling of components onto said substrate by reflow soldering or by wave soldering.

26. Process according to claim 25, wherein said reflow soldering or wave soldering are performed after at least one of the components have been assembled.

27. Process according to claim 23, wherein said curing step is performed by light radiation.

28. Process according to claim 27, wherein said curing step is performed by UV light radiation.

29. Process according to claim 27, further comprising the assembling of components onto said substrate by reflow soldering or by wave soldering.

30. Process for manufacturing an apparatus comprising at least one substrate and at least one component, said substrate having a surface with a plurality of bonding pads which are metal, said component having a plurality of bonding pads, the bonding pads on the substrate corresponding to the bonding pads on the component, said component being attached to and in electrical contact with said substrate, characterized in that said process comprises the following steps:

dispensing an adhesive onto said bonding pads of said substrate or onto said bonding pads of said component;

drying said adhesive;

applying an underfill material on an area situated between said bonding pads of said substrate;

aligning the bonding pads of said component with at least some of the bonding pads of the substrate;

exerting a mechanical pressure on said component; and curing said adhesive and said underfill material, said step of curing being performed while maintaining said mechanical pressure, thereby creating electrical contacts between said component and said substrate, wherein said step of drying being performed at a temperature below the curing temperatures of both the adhesive and the underfill material.

31. Process according to claim 30, wherein said step of drying is performed in an oven.

32. Process according to claim 30, wherein said step of drying is performed at a temperature less than 110° C.

33. Process according to claim 30, wherein said curing step is performed at a curing temperature less than 130° C.

* * * * *